United States Patent
Genest et al.

(10) Patent No.: US 10,076,053 B2
(45) Date of Patent: Sep. 11, 2018

(54) SCREW ATTACHMENT SYSTEM FOR ELECTRONIC ASSEMBLIES

(71) Applicant: International Business Machines Corporation, Armonk, NY (US)

(72) Inventors: Robert R. Genest, Poughkeepsie, NY (US); John J. Loparco, Poughkeepsie, NY (US); Robert K. Mullady, Highland, NY (US); John G. Torok, Poughkeepsie, NY (US); Wade H. White, Hyde Park, NY (US); Mitchell L. Zapotoski, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 15/193,412

(22) Filed: Jun. 27, 2016

(65) Prior Publication Data
US 2016/0309609 A1    Oct. 20, 2016

Related U.S. Application Data

(63) Continuation of application No. 14/607,362, filed on Jan. 28, 2015, now Pat. No. 9,426,924.

(51) Int. Cl.
*G06F 1/16*    (2006.01)
*H05K 5/00*    (2006.01)
(Continued)

(52) U.S. Cl.
CPC ......... *H05K 7/1489* (2013.01); *H05K 7/1487* (2013.01); *H05K 7/1492* (2013.01); *H05K 7/20736* (2013.01)

(58) Field of Classification Search
CPC ............................................. G06F 1/18–1/189
(Continued)

(56) References Cited

U.S. PATENT DOCUMENTS 5,193,050 A    3/1993    Dimmick et al.
5,590,024 A *  12/1996    Honda ................. G06F 1/1616
                                                            361/679.32
(Continued)

FOREIGN PATENT DOCUMENTS

DE    202008009796 U1    11/2008
EP        2228812 A1      9/2010
(Continued)

OTHER PUBLICATIONS

STIC search report.
(Continued)

*Primary Examiner* — Anthony Haughton
(74) *Attorney, Agent, or Firm* — Scully, Scott, Murphy & Presser, P.C.; Tihon Poltavets

(57) ABSTRACT

An apparatus for mating computing device structures. The apparatus comprises a first bracket coupled to a pluggable electronic device. The first bracket comprises a first set of one or more attachment features that are capable of coupling to corresponding receiving features of a supporting structure. The apparatus further comprises a second bracket coupled to the pluggable electronic device. The second bracket comprises a second set of one or more attachment features that are capable of coupling to corresponding receiving features of a supporting structure. In another aspect, the apparatus further comprises one or more guide tubes coupled to the pluggable electronic device.

19 Claims, 9 Drawing Sheets

(51) Int. Cl.
*H05K 7/00* (2006.01)
*H05K 7/14* (2006.01)
*H05K 7/20* (2006.01)

(58) Field of Classification Search
USPC ................. 361/679.31–679.39, 724–727
See application file for complete search history.

(56) References Cited

U.S. PATENT DOCUMENTS

| | | | |
|---|---|---|---|
| 6,378,965 B1 | 4/2002 | Reznikov et al. | |
| 6,515,855 B1 | 2/2003 | Yen-Kuang | |
| 6,762,934 B2 | 7/2004 | Kitchen et al. | |
| 7,113,401 B2 | 9/2006 | Becker et al. | |
| 7,561,416 B1 * | 7/2009 | Sarraf | G06K 13/08 361/679.32 |
| 7,911,776 B2 | 3/2011 | Ikeda et al. | |
| 8,009,425 B2 | 8/2011 | Kang | |
| 8,023,263 B2 | 9/2011 | Crippen et al. | |
| 8,289,707 B2 * | 10/2012 | Liao | H04Q 1/023 361/679.58 |
| 8,295,019 B2 | 10/2012 | Gronwald | |
| 8,611,103 B2 * | 12/2013 | Thomas | H05K 7/1411 361/679.58 |
| 8,638,563 B2 | 1/2014 | Peng et al. | |
| 9,775,263 B2 * | 9/2017 | Ross | H05K 7/1489 |
| 2001/0001529 A1 * | 5/2001 | Behl | G11B 25/043 312/223.1 |
| 2003/0030991 A1 | 2/2003 | Riddiford et al. | |
| 2003/0030993 A1 | 2/2003 | Kitchen et al. | |
| 2004/0231826 A1 | 11/2004 | Armstrong | |
| 2005/0265003 A1 | 12/2005 | Coglitore et al. | |
| 2007/0026718 A1 | 2/2007 | Sturm et al. | |
| 2009/0073649 A1 | 3/2009 | Ikeda et al. | |
| 2009/0086456 A1 * | 4/2009 | Milo | H05K 7/1409 361/801 |
| 2009/0201642 A1 | 8/2009 | Diaz | |
| 2009/0218921 A1 | 9/2009 | Furey et al. | |
| 2010/0062644 A1 | 3/2010 | Aekins et al. | |
| 2010/0172083 A1 * | 7/2010 | Randall | G11B 33/126 361/679.31 |
| 2012/0127658 A1 | 5/2012 | Hartman et al. | |
| 2013/0265695 A1 | 10/2013 | Canfield et al. | |

FOREIGN PATENT DOCUMENTS

| | | |
|---|---|---|
| WO | 2004107503 A1 | 12/2004 |
| WO | 2008128094 A1 | 10/2008 |

OTHER PUBLICATIONS

Baitinger et al., "System control structure of the IBM eServer z900", IBM J. Res. & Dev., vol. 46, No. 4/5 Jul./Sep. 2002, © 2002 International Business Machines Corporation, pp. 523-535, accepted for publication Apr. 3, 2002.

Fahy et al., "Desiogning for Manufacturing: Don't Forget the access hardware", Machine Design, Oct. 5, 2000.

Gedney et al., "Complementing Technologies for MCM Success", D.A.Doane et al., (eds.), Multichip Module Technologies and Alternatives: The Basics, © Springer Science+Business Media New York 1993, pp. 817-842.

Goth et al., "Hybrid cooling with cycle steering in the IBM eServer z990", IBM J. Res. & Dev., vol. 48, No. 3/4, May/Jul. 2004, pp. 409-423, accepted for publication Mar. 3, 2004 © 2004 International Business Machines Corporation.

Katopis et al., "T-Rex, A Blade Packaging Architecture for Mainframe Servers", IEEE Transactions on Advanced Packaging, vol. 28, No. 1, Feb. 2005, Digital Object Identifier 10.1109/TADVP. 2004.841649, Manuscript Revised Aug. 24, 2004, pp. 24-31.

Larsson et al., "Self-Aligning MEMS In-Line Separable Electrical Connector", IEEE, Journal of Microeletromechanical Systems, vol. 13, No. 2, Apr. 2004, Digital Object Identifier 10.1109/JMEMS. 2004.825238, manuscript revised Oct. 21, 2003, pp. 365-376.

\* cited by examiner

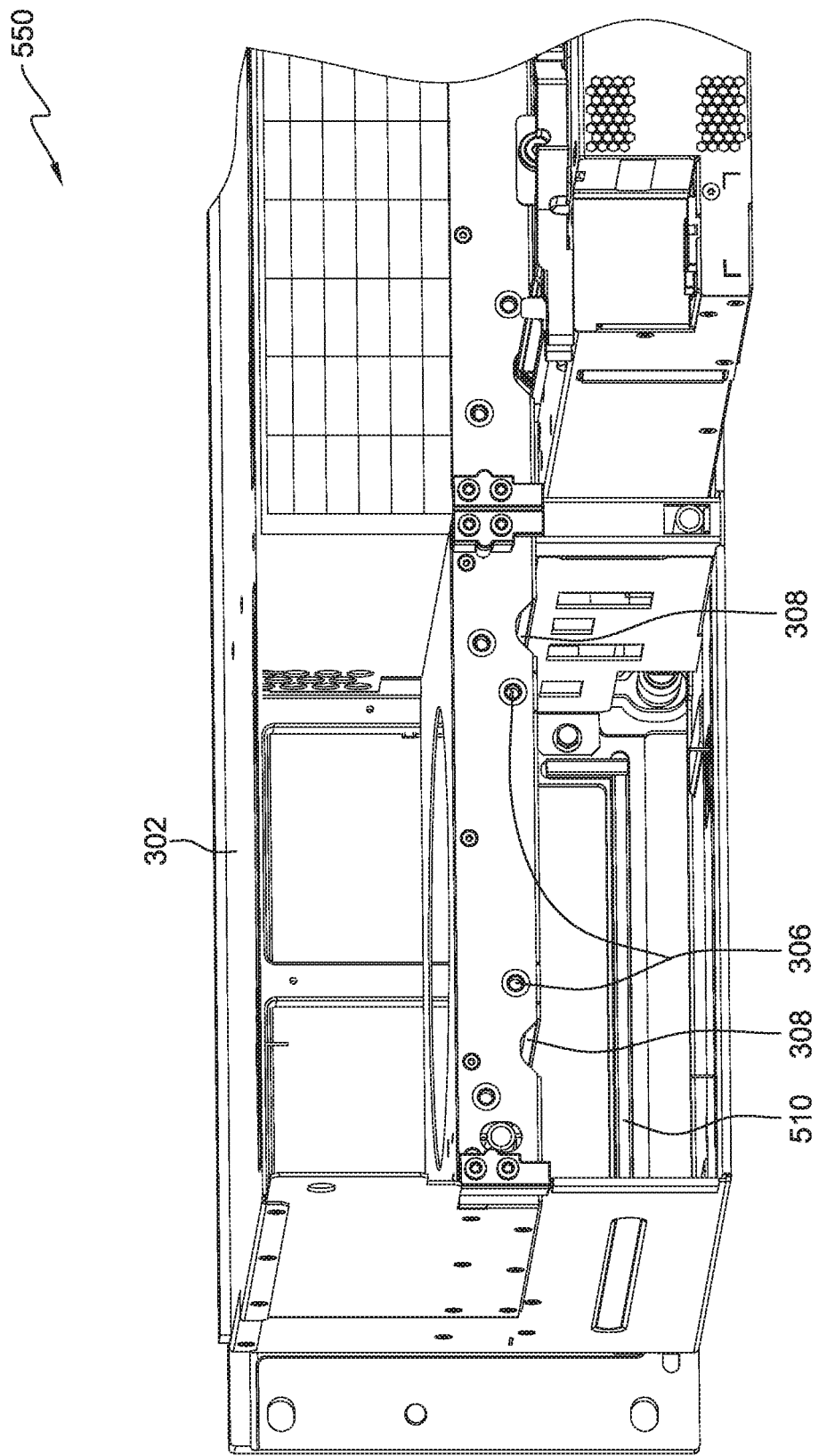

SCREW ATTACHMENT SYSTEM FOR ELECTRONIC ASSEMBLIES

BACKGROUND

The present invention relates generally to the field of computing device structures, and more particularly to a screw attachment system for electronic assemblies.

A central electronic complex (CEC) structure is a set of hardware that defines a computer assembly (e.g., a mainframe computer), which includes central processing units (CPUs), computer memory, communication channels, data controllers, storage devices, power supplies, and other computing components. A CEC can be installed into a rack (e.g., a server rack) that is a component of a mainframe computer assembly or another collection of computing devices. Mainframe computers are computing systems that are utilized for critical applications and bulk data processing, such as statistical processing, enterprise resource planning, and transaction processing.

CECs are capable of connecting and interfacing with additional computing components and electronic assemblies of a mainframe computer or other computing system, and many such components are capable of plugging into a CEC. For example, a power supply can be a pluggable device that can be attached to a CEC as part of a mainframe computer assembly. In additional examples, distributed converter assemblies (DCAs) can be pluggable electronic assembly devices that may be installed with a connection to a CEC.

SUMMARY

One aspect of the invention discloses an apparatus for mating computing device structures. The apparatus comprises a first bracket coupled to a pluggable electronic device. The first bracket comprises a first set of one or more attachment features that are capable of coupling to corresponding receiving features of a supporting structure. The apparatus further comprises a second bracket coupled to the pluggable electronic device. The second bracket comprises a second set of one or more attachment features that are capable of coupling to corresponding receiving features of a supporting structure. In another aspect, the apparatus further comprises one or more guide tubes coupled to the pluggable electronic device. The one or more guide tubes each comprises an opening through the one or more guide tubes, wherein the opening is aligned to a respective attachment feature of the second set of one or more attachment features.

BRIEF DESCRIPTION OF THE DRAWINGS

The following detailed description, given by way of example and not intended to limit the disclosure solely thereto, will best be appreciated in conjunction with the accompanying drawings, in which:

FIG. 5B illustrates a supporting structure, in accordance with embodiments of the present invention.

DETAILED DESCRIPTION

Figure 1:
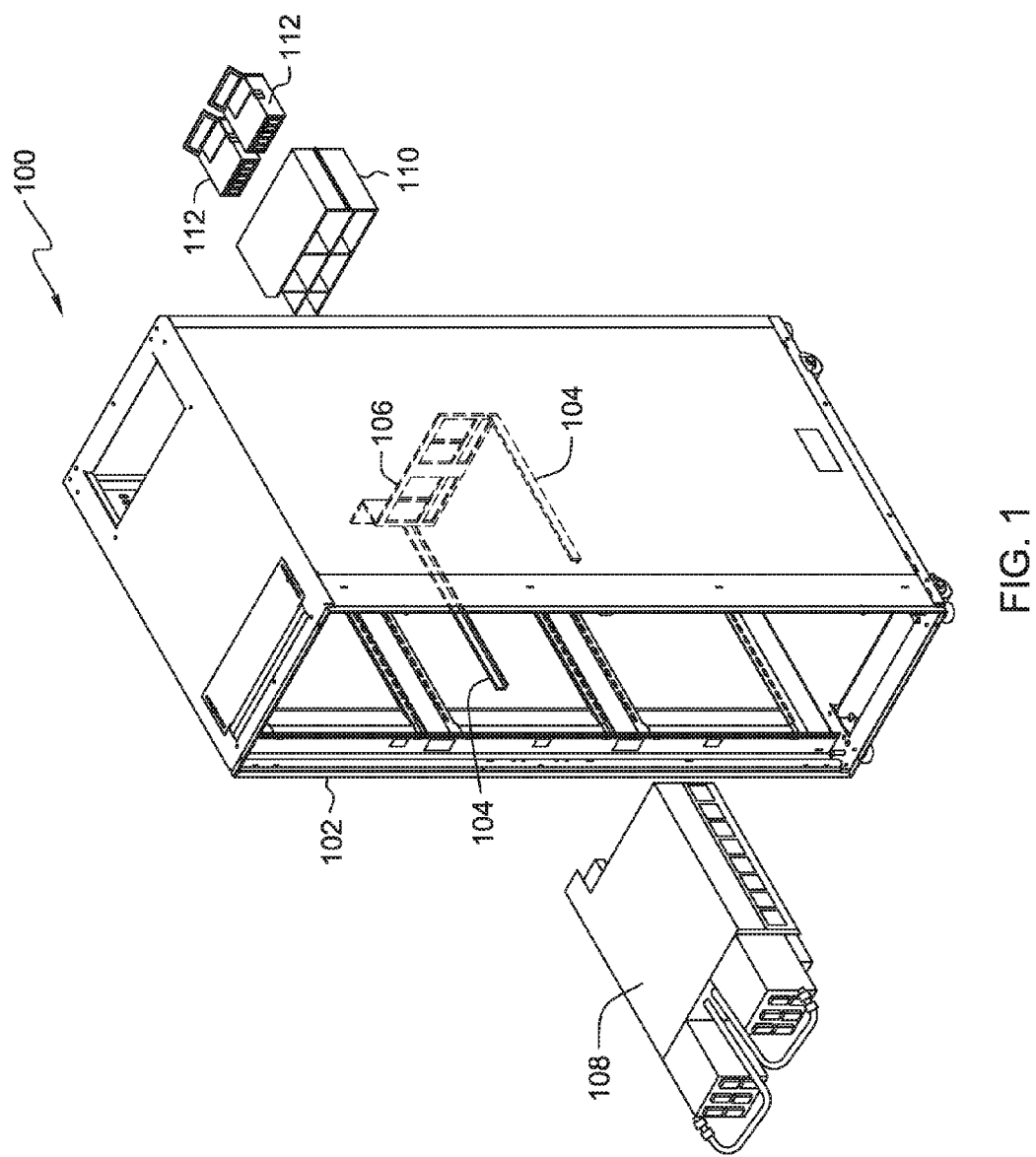
FIG. 1 is an example depiction illustrating a data processing system, in accordance with one embodiment of the present invention.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. Additionally, the terms "coupled to" and "attached to" mean that a first element, such as a first structure, is coupled to a second element, such as a second structure, wherein intervening elements, such as an interface structure may be present between the first element and the second element.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Embodiments of the present invention provide a multiple screw attachment system to attach an electronic assembly to a supporting structure, which can mechanically isolate the electronic assemblies.

The present invention will now be described in detail with reference to the Figures. FIG. 1 is an example depiction illustrating data processing system 100, in accordance with one embodiment of the present invention. FIG. 1 illustrates an exploded view of example computing components that may be assembled together in a computing system of data processing system 100. Data processing system 100 can be a mainframe computer or assembly of computing systems that utilizes a system frame (e.g., a system rack). Data processing system 100 includes rack 102, rails 104, bulkhead 106, central electronic complex (CEC) 108, air moving assembly (AMA) 110, and distributed converter assemblies (DCAs) 112.

Rack 102 is a system frame (e.g., a server rack, a server cabinet, a computer cabinet), which is capable of housing multiple computing systems (e.g., CEC 108). Rack 102 can include one or more sets of rails 104, which allow for a horizontal installation of computing systems into rack 102. Rails 104 are coupled to the side-walls of rack 102 and provide structural support to a horizontally installed computing system (e.g., CEC 108). In other embodiments, rails 104 can be in a different configuration and/or location within rack 102, while still providing support to a computing device. In additional embodiments, rack 102 can include additional instances of rails 104 (not shown), which allows additional computing devices to be installed and housed within rack 102. Rack 102 further includes one or more instances of bulkhead 106. Bulkhead 106 provides a back surface to which computing devices that are installed in rack 102 (on rails 104) can be structurally coupled. For example, a computing device (e.g., CEC 108) is installed in rack 102 on rails 104, and a portion (e.g., a back portion) of the computing device is structurally coupled to bulkhead 106. In various embodiments, bulkhead 106 is capable of interfacing with computing devices (e.g., AMA 110 and DCAs 112) on both sides of bulkhead 106 (e.g., via gasket features, screw retention features, brackets, etc.).

Central electronic complex (CEC) 108 is computing structure that includes a set of hardware that defines a computer assembly (e.g., a mainframe computer or other computing system utilizing a system frame, such as rack 102). In example embodiments, CEC 108 can include, or attach to, computing components including central processing units (CPUs), computer memory, communication channels, data controllers, storage devices, power supplies, etc. In one embodiment, CEC 108 is installed horizontally into rack 102 utilizing rails 104 and is structurally coupled to bulkhead 106. CEC 108 may be secured within rack 102 and structurally coupled to bulkhead 106 utilizing a variety of known techniques.

Air moving assembly (AMA) 110 is a supporting structural enclosure that provides the ability to enclose the air-moving devices (AMDs) and DCAs that are attached to CEC 108. In an example embodiment, AMA 110 is a metal enclosure that includes a plurality of sections that are capable of enclosing and housing computing components. For example, AMA 110 is capable of providing a supporting enclosure for devices, such as DCAs 112. In one embodiment, AMA 110 is installed horizontally by structurally coupling AMA 110 to bulkhead 106 (e.g., on an opposite side of bulkhead 106 relative to the installation of CEC 108). In various embodiments, AMA 110 can be structurally coupled to CEC 108 via bulkhead 106. AMA 110 may be secured (e.g., to bulkhead 106 and/or CEC 108) utilizing a variety of known techniques.

Distributed converter assemblies (DCAs) 112 are pluggable devices, which can include electronic assembly interconnects, that can plug into CEC 108 and be enclosed by AMA 110. In various embodiments, DCAs 112 can be a variety of computing components or electronic assemblies that can plug into, and structurally attach to, CEC 108 (e.g., via bulkhead 106). In another embodiment, DCAs 112 can be computing components that can be enclosed and supported by a section of AMA 110. In an example, DCAs 112 are each an assembly of power supplies and cooling fans that comprise a pluggable device (e.g., into CEC 108). In one embodiment, DCAs 112 are installed (e.g., plugged into and attached to) in connection to CEC 108 and enclosed by AMA 110. In another embodiment, electronic assembly interconnects of DCAs 112 are mated to corresponding receiving electronic assemble interconnects of CEC 108. In yet another embodiment, DCAs 112 can attach to CEC 108 via bulkhead 106.

Figure 2:
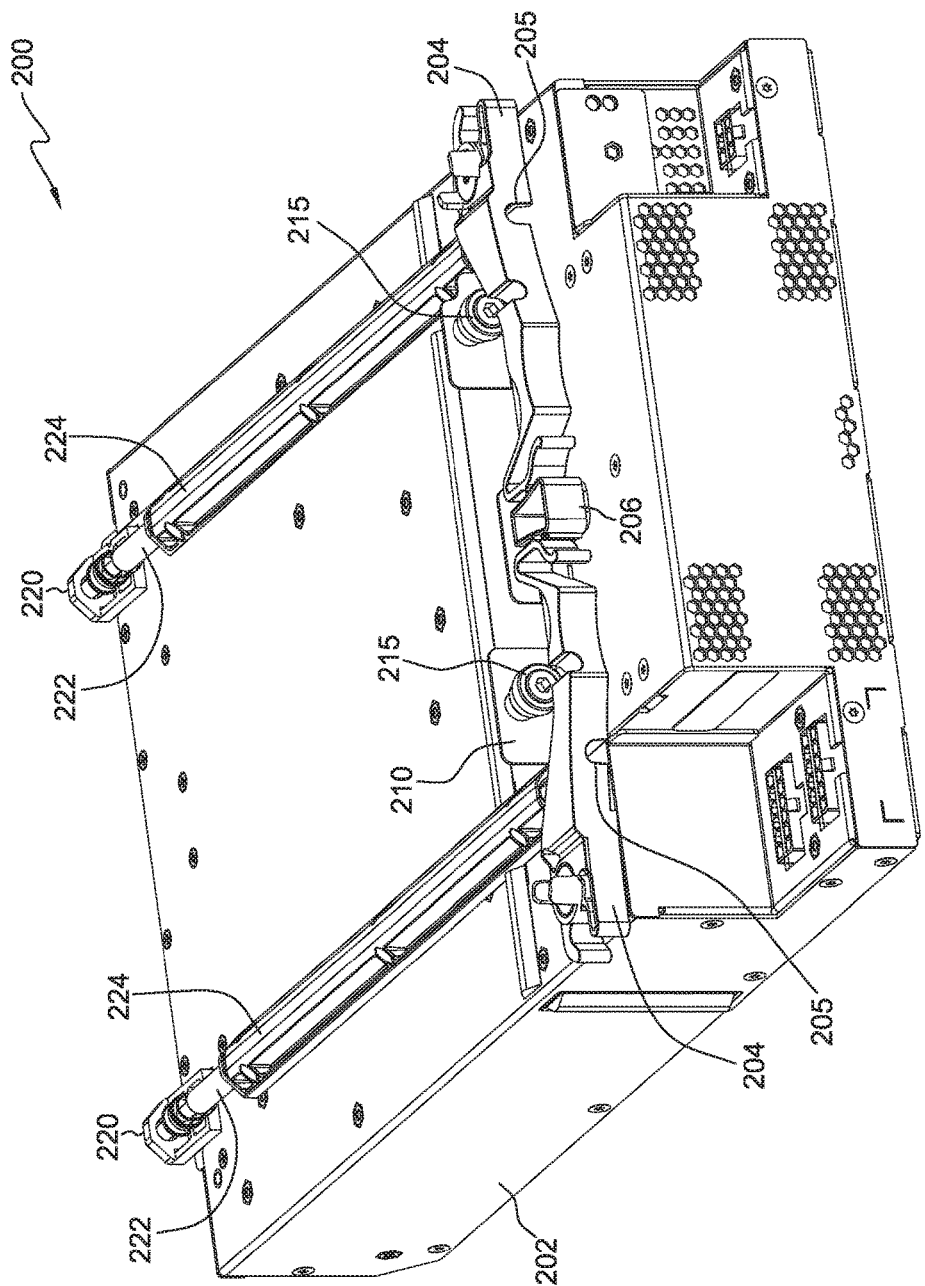
FIG. 2 illustrates an electronic assembly that includes a screw attachment system, in accordance with embodiments of the present invention.

FIG. 2 illustrates a view of electronic assembly 200, in accordance with embodiments of the present invention.

Electronic assembly 200 includes DCA 202, which is an example of an electronic assembly device. In one embodiment, DCA 202 is an electronic assembly device, such as an instance of DCAs 112 (previously described in FIG. 1). In an example, DCA 202 is an assembly of power supplies and cooling fans that comprise a pluggable device (e.g., into a supporting structure, such as an AMA).

DCA 202 includes latches 204, which are resident to DCA 202. Latches 204 are rotatable latches that rotate on a pivot point and are capable of (at least partially) securing DCA 202 to a supporting structure (e.g., an AMA). In an example embodiment, latches 204 include latch claw features that, when latches 204 are closed, engage to a latch claw catch of a supporting structure and (at least partially) secure DCA 202 to a supporting structure and mate electronic connectors of DCA 202 to another electronic assembly (e.g., a CEC). In various embodiments, latches 204 can be made of various materials known in the art (e.g., 1008 steel, 6061 aluminum, etc.). In another embodiment, latches 204 include respective latch openings 205. Latch openings 205 are recessed features of latches 204 that facilitate access of a tool to guide tubes 224 once latches 204 are in a closed position. In other embodiments, latches 204 can include additional instances of latch openings 205; for example, latch openings to facilitate access to retention screws 215, etc.

DCA 202 also includes latch catch 206, bracket 210, and retention screws 215. In one embodiment, latch catch 206 is coupled to bracket 210 and/or DCA 202. Latch catch 206 is a structure that is capable of retaining latches 204 in place when latches 204 are in a closed position (e.g., when DCA 202 is plugged into a system and also when DCA 202 is not plugged into a system. In various embodiments, latch catch 206 is capable of retaining latches 204 in place, which limits exposure of latches 204 to damage. Bracket 210 is attached to DCA 202 and houses retention screws 215. In one embodiment, bracket 210 is attached to DCA 202 utilizing screws. In other embodiments, bracket 210 can attach to DCA 202 utilizing other methods known in the art. In various embodiments, bracket 210 can be made of various materials known in the art (e.g., 1008 steel, 6061 aluminum, etc.). Bracket 210 holds retention screws 215 in place and aligns retention screws with corresponding threaded receivers in a supporting structure (e.g., an AMA). In an example embodiment, bracket 210 includes one or more openings in which retention screws 215 are housed. The openings are capable of holding retention screws 215 in place and allowing retention screws 215 to rotate and screw into corresponding threaded receiving assemblies (e.g., in an AMA). In other embodiments, bracket 210 can be a form or structure coupled to DCA 202 that is different than depicted in FIG. 2, providing that another form of bracket 210 is capable of housing one or more instances of retention screws 215 and aligning retention screws 215 with corresponding threaded receiving assemblies in a supporting structure. In an example, bracket 210 is designed in such a manner that openings in bracket 210 align with corresponding threaded receiving assemblies in a corresponding supporting structure.

Retention screws 215 are attachment features that are housed in bracket 210 and support attachment of DCA 202 to a supporting structure (e.g., an AMA). In one embodiment, retention screws 215 are one or more screws that are capable of screwing into corresponding threaded receiving features of a supporting structure. In an example embodiment, retention screws 215 include a cap, which allow manual tightening of retention screws 215 (e.g., hand-tightening by a human). In another example embodiment, retention screws 215 include a head portion that is capable of tightening from a tool (e.g., manually from a human or from a machine). In other embodiments, retention screws 215 can be other forms of fasteners that are capable of being housed by bracket 210 and coupling DCA 202 to a supporting structure (e.g., mechanically coupling and/or adhesively coupling).

DCA 202 also includes screw bracket 220, spring-loaded screw assemblies 222, and guide tubes 224. Screw bracket 220 is attached to DCA 202 and houses spring-loaded screw assemblies 222. In one embodiment, screw bracket 220 houses spring-loaded screw assemblies 222, which are retracted during installation and removal processes of DCA 202. Screw bracket 220 is discussed in further detail with regard to bracket assembly 400 in FIG. 4.

Spring-loaded screw assemblies 222 are attachment features that are housed in spring bracket 220 and support attachment of DCA 202 to another electronic assembly device (e.g., to a CEC via coupling to a bulkhead). In one embodiment, spring-loaded screw assemblies 222 are one or more floating, spring-loaded screws that are capable of screwing into corresponding threaded receiving features of a supporting structure (e.g., a bulkhead of a CEC). For example, spring-loaded screw assemblies 222 are spring-loaded floating screws that are housed in screw bracket 220. Spring-loaded screw assemblies 222 include a head portion on the end of spring-loaded screw assemblies 222 facing guide tubes 224, which facilitates receiving a tool to screw spring-loaded screw assemblies 222 into a supporting structure. In other embodiments, spring-loaded screw assemblies 222 can be other forms of attachment features or spring-loaded fasteners that are capable of coupling DCA 202 to another electronic assembly device (e.g., via mechanical coupling to a bulkhead).

In the depicted embodiment of electronic assembly 200, spring-loaded screw assemblies 222 are retracted and housed in screw bracket 220 (e.g., retracted into an enclosed position in screw bracket 220). Spring-loaded screw assemblies 222 are retracted during installation and removal processes of DCA 202 (e.g., when DCA 202 is not attached to a supporting structure or when a tool is not engaging spring-loaded screw assemblies 222, etc.). For example, spring-loaded screw assemblies 222 are self-retracting assemblies and when removing DCA 202 from a supporting structure, such as an AMA, spring-loaded screw assemblies 222 retract back into bracket 210. In an additional embodiment, bracket 210 (i.e., a bracket housing the screws attaching the DCA to the AMA) includes a nominal gap to ensure that, with tolerances, bracket 210 will not prevent spring-loaded screw assemblies 222 from reaching the mechanical down-stop position (e.g., when screwing into a bulkhead of a CEC).

Guide tubes 224 are attached to DCA 202, and the openings in guide tubes 224 are aligned with latch openings 205, spring-loaded screw assemblies 222, and openings of screw bracket 220. Guide tubes 224 facilitate access of a tool to spring-loaded screw assemblies 222. In one embodiment, guide tubes 224 assist a tool with aligning to, and screwing in, spring-loaded screw assemblies 222 (e.g., into a bulkhead).

Figure 3:
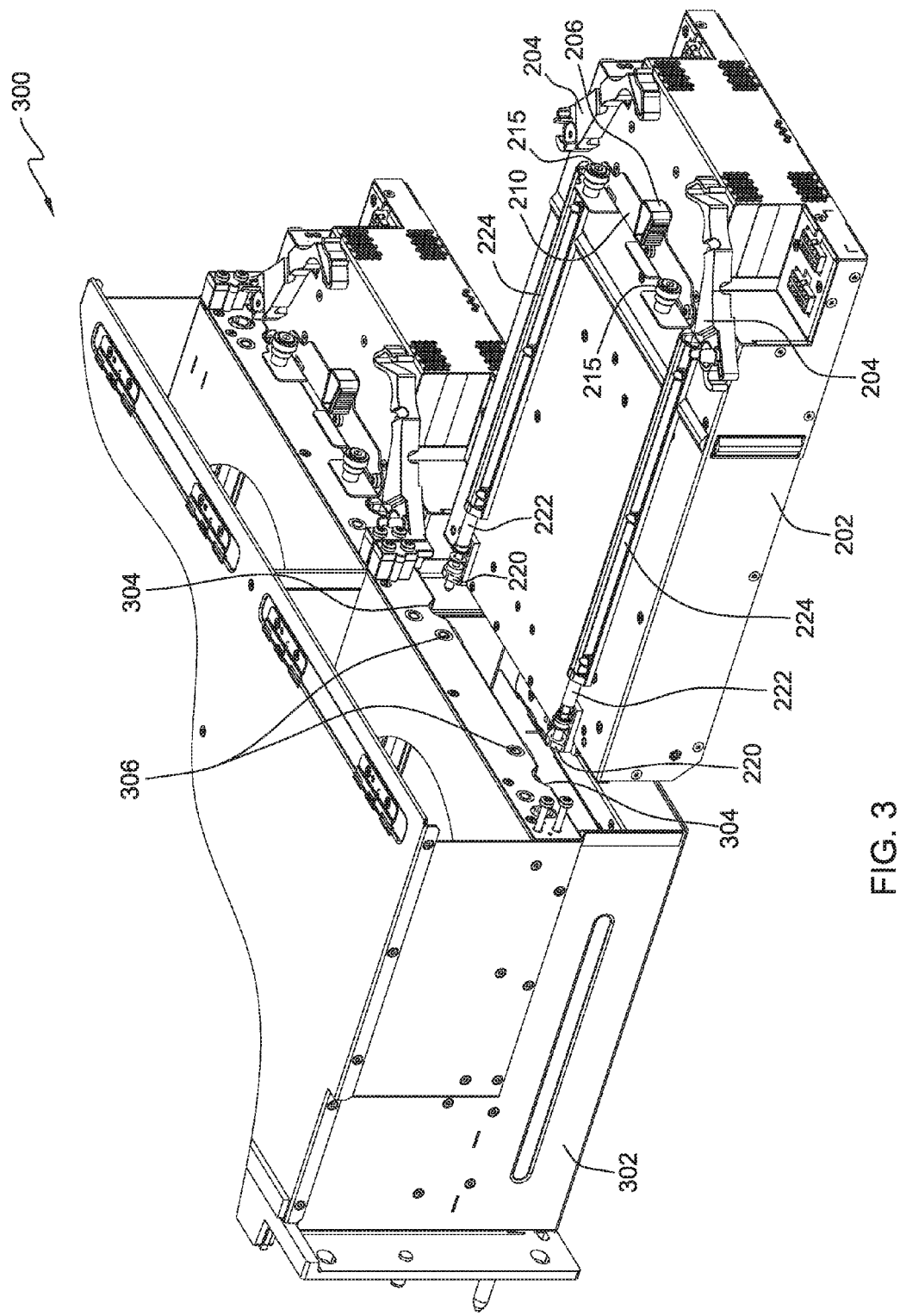
FIG. 3 illustrates an installation of electronic assembly that includes a screw attachment system into a supporting structure, in accordance with embodiments of the present invention.

FIG. 3 illustrates a view of electronic assembly installation 300, in accordance with embodiments of the present invention.

Electronic assembly installation 300 includes DCA 202 and AMA 302. In the depicted embodiment of FIG. 3, DCA 202 is shown prior to insertion (e.g., installation) into an opening of AMA 302. In one embodiment, AMA 302 is a support structure, such as AMA 110 (previously described in FIG. 1). In an example, AMA 302 is a supporting structural enclosure that provides the ability to enclose the air-moving devices (AMDs) and DCAs (e.g., DCA 202) that are attached to a CEC (e.g., CEC 108 in FIG. 1).

AMA 302 includes guide tube relief bumps 304 and threaded receivers 306. Guide tube relief bumps 304 are features of AMA 302 that provide recesses to accommodate guide tubes 224 and screw bracket 220 when inserting DCA 202 into AMA 302. In an example embodiment, guide tube relief bumps 304 provide at least enough space to allow DCA 202 to be installed in AMA 302, while allowing guide tubes 224 to not interfere with the installation process. AMA 302 includes a number of guide tube relief bumps 304 that corresponds to the number of guide tubes 224 and spring-loaded screw assemblies 222 of DCA 202.

Threaded receivers 306 are threaded screw receiving features of AMA 302, which receive retention screws 215 of DCA 202. Threaded receivers 306 are aligned with retention screws 215 (e.g., as defined by bracket 210), allowing retention screws 215 to be advanced (e.g., screwed into) threaded receivers 306 when DCA 202 is inserted into AMA 302. In example embodiments, threaded receivers 306 include threading that corresponds to retention screws 215. In other embodiments, threaded receivers 306 can be other forms of receiving features that are capable of coupling to retention screws 215 (e.g., receiving features for fasteners).

In an example, for assembly of DCA 202 into AMA 302, DCA 202 is inserted into a corresponding opening of AMA 302, and latches 204 are closed, which mates electronic connections of DCA 202 to another electronic assembly device (e.g., to a CEC). A tool is inserted through latch openings 205 and guide tubes 224 to engage spring-loaded screw assemblies 222, and the tool advances spring-loaded screw assemblies 222 (e.g., compressing the springs of the screw assemblies) through the opening of bracket 210 and into corresponding screw receiving features of a bulkhead of a CEC. In addition, retention screws 215 are torqued, which advances retention screws 215 into threaded receivers 306 of AMA 302. In another example embodiment, latches 204 are closed (e.g., pivoted to a closed position), which engages latch catch 206. Latch catch 206 retains latches 204 in the closed position.

Figure 4:
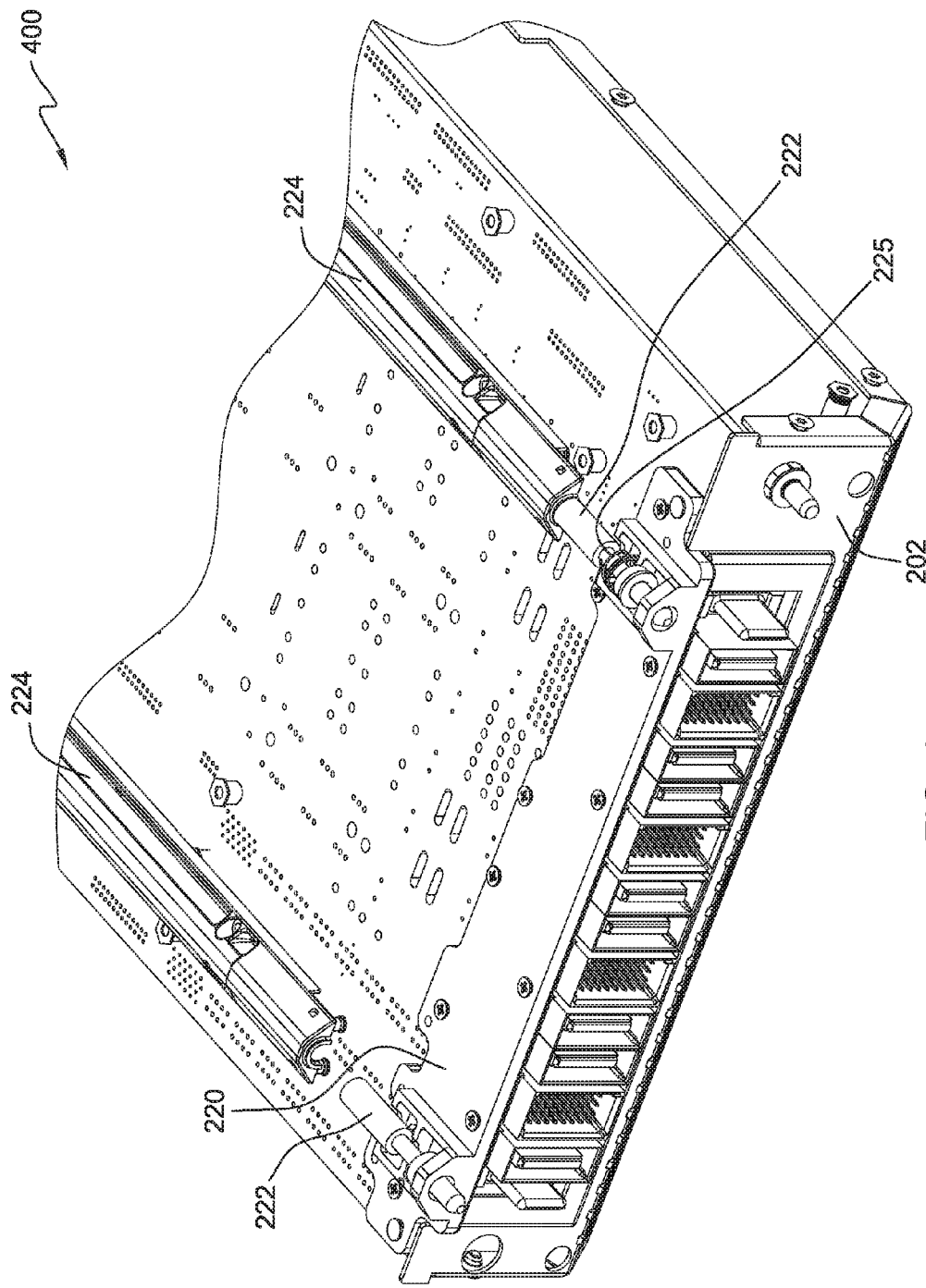
FIG. 4 illustrates a bracket assembly coupled to an electronic assembly that includes a screw attachment system, in accordance with embodiments of the present invention.

FIG. 4 illustrates a view of bracket assembly 400, in accordance with embodiments of the present invention.

Bracket assembly 400 includes bracket 210, which is attached to DCA 202. Bracket 210 houses spring-loaded screw assemblies 222, which include spring 225. Spring 225 allows spring-loaded screw assemblies 222 to be self-retracting. For example, when DCA 202 is removed from AMA 302, spring-loaded screw assemblies 222 retract back into bracket 210. Spring-loaded screw assemblies 222 are retracted when the end portions of spring-loaded screw assemblies 222 (e.g., the threaded portions) are contained within bracket 210 (e.g., the threaded portions are not exposed outside of bracket 210). In various embodiments, spring 225 can be any of a variety of springs known in the art (e.g., as a component of a spring-loaded floating screw), in accordance with embodiments of the present invention. In an example embodiment, spring-loaded screw assemblies 222 are spring-loaded to ensure that spring-loaded screw assemblies 222 are recessed from the bulkhead during initial installation of DCA 202 and so that spring-loaded screw assemblies 222 self-retract prior to removal of DCA 202 from AMA 302.

In the depicted embodiment, the base portion (e.g., the portion attached to DCA 202) of bracket 210 is exposed due to a removal of a top cover of DCA 202. In one embodiment, bracket 210 is coupled to DCA 202 utilizing inherent retention screws of a card connector of DCA 202 (and is registered to the card connector), which increases dimensional tolerance control of the assembly. In other embodiments, bracket 210 can attach to DCA 202 utilizing other known fastening methods, provided that spring-loaded screw assemblies 222 are aligned with corresponding receiving features of a bulkhead.

Figure 5A:
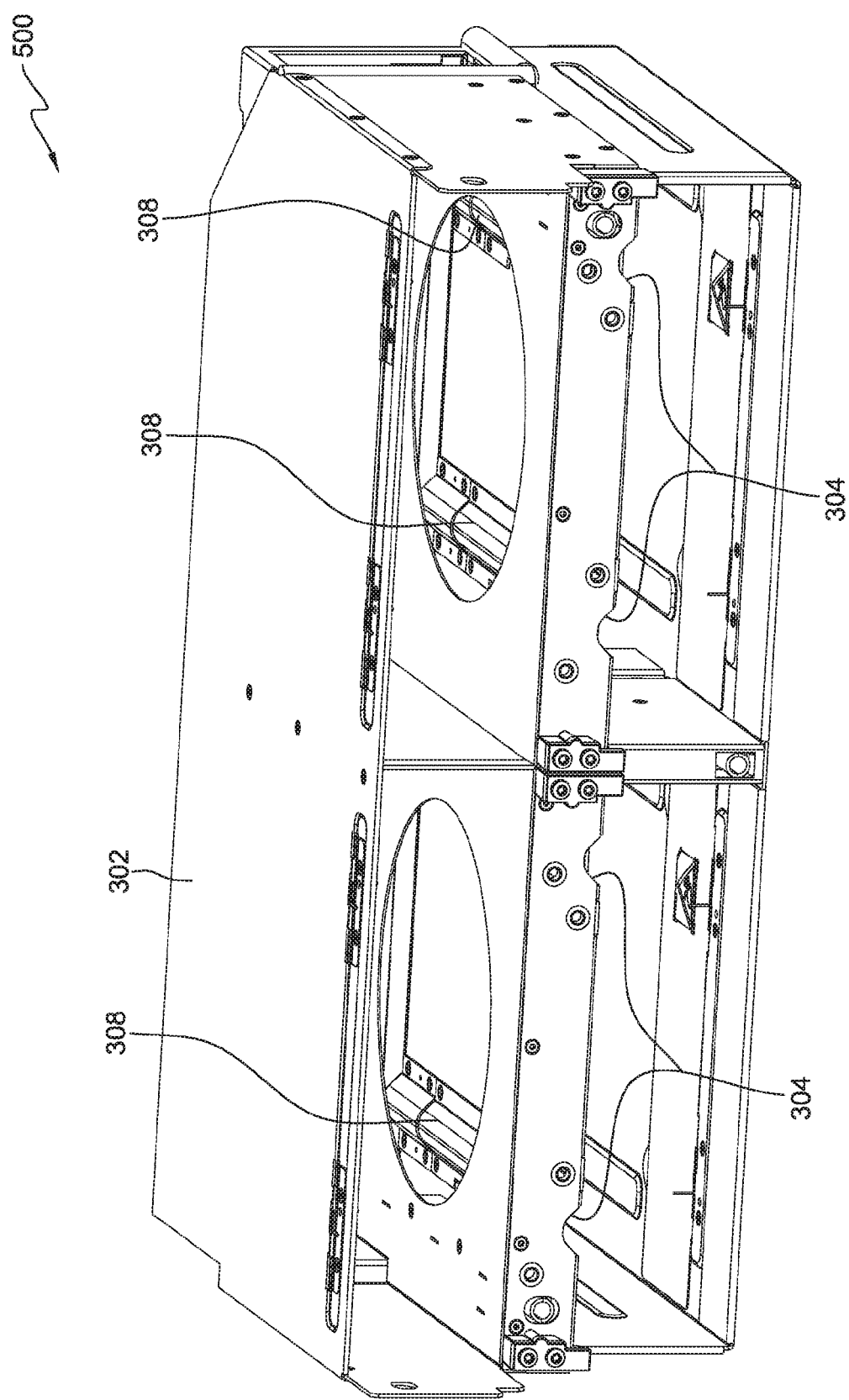
FIG. 5A illustrates a supporting structure, in accordance with embodiments of the present invention.

FIG. 5A illustrates a view of supporting structure 500, in accordance with embodiments of the present invention.

In the depicted embodiment, supporting structure 500 includes AMA 302. AMA 302 is previously described in greater detail with regard to FIG. 3. In one embodiment, AMA 302 is a support structure, such as AMA 110 (previously described in FIG. 1). AMA 302 includes guide tube relief bumps 304 and guide tube relief bumps 308.

Guide tube relief bumps 304 are features of AMA 302 that provide recesses to accommodate guide tubes 224 and screw bracket 220 when inserting DCA 202 into AMA 302 (discussed in greater detail with regard to FIG. 3). In the depicted embodiment, guide tube relief bumps 304 are recess features on the face of AMA 302 that accommodate insertion of guide tubes of a DCA into AMA 302, and guide tube relief bumps 308 are recess features through AMA 302 that accommodate insertion of guide tubes of a DCA into AMA 302. For example, guide tube relief bumps 304 allow insertion of a DCA with guide tubes into the face of AMA 302, and guide tube relief bumps 308 allow insertion of the DCA with guide tubes through AMA 302.

FIG. 5B illustrates a view of supporting structure 550, in accordance with embodiments of the present invention.

In the depicted embodiment, supporting structure 550 includes AMA 302 and gasket 510. AMA 302 is previously described in greater detail with regard to FIGS. 3 and 5A. AMA 302 includes threaded receivers 306 and guide tube relief bumps 308.

Threaded receivers 306 are threaded screw receiving features of AMA 302, which receive retention screws from an electronic assembly, such as a DCA. The depicted embodiment of FIG. 5B, AMA 302 depicts the bottom side of guide tube relief bumps 308, which allow insertion of the DCA with guide tubes through AMA 302.

Gasket 510 is a feature of a bulkhead, such as bulkhead 106 (previously described in FIG. 1), which facilitates prevention of excessive electromagnetic interference (EMI) energy from escaping from the area surrounding the mated connection between a DCA and the bulkhead. In an example embodiment, gasket 510 is a mechanical seal that fills the space between two mating surfaces, such as a bulkhead and a DCA. In various embodiments, gasket 510 can be comprised of materials known and utilized in the art. In on embodiment, a DCA (e.g., DCA 202) is inserted into AMA 302, and electronic connections of the DCA mate with corresponding electronic connections of a CEC, through the opening in AMA 302 that is surrounded by gasket 510. Then, when the DCA is secured to AMA 302 and the electronic connections of the DCA are secured to the corresponding connections of the CEC (e.g., utilizing retention screws 215, spring-loaded screw assemblies 222, and latches 204), gasket 510 provides a seal surrounding the mated electronic connections.

Figure 6A:
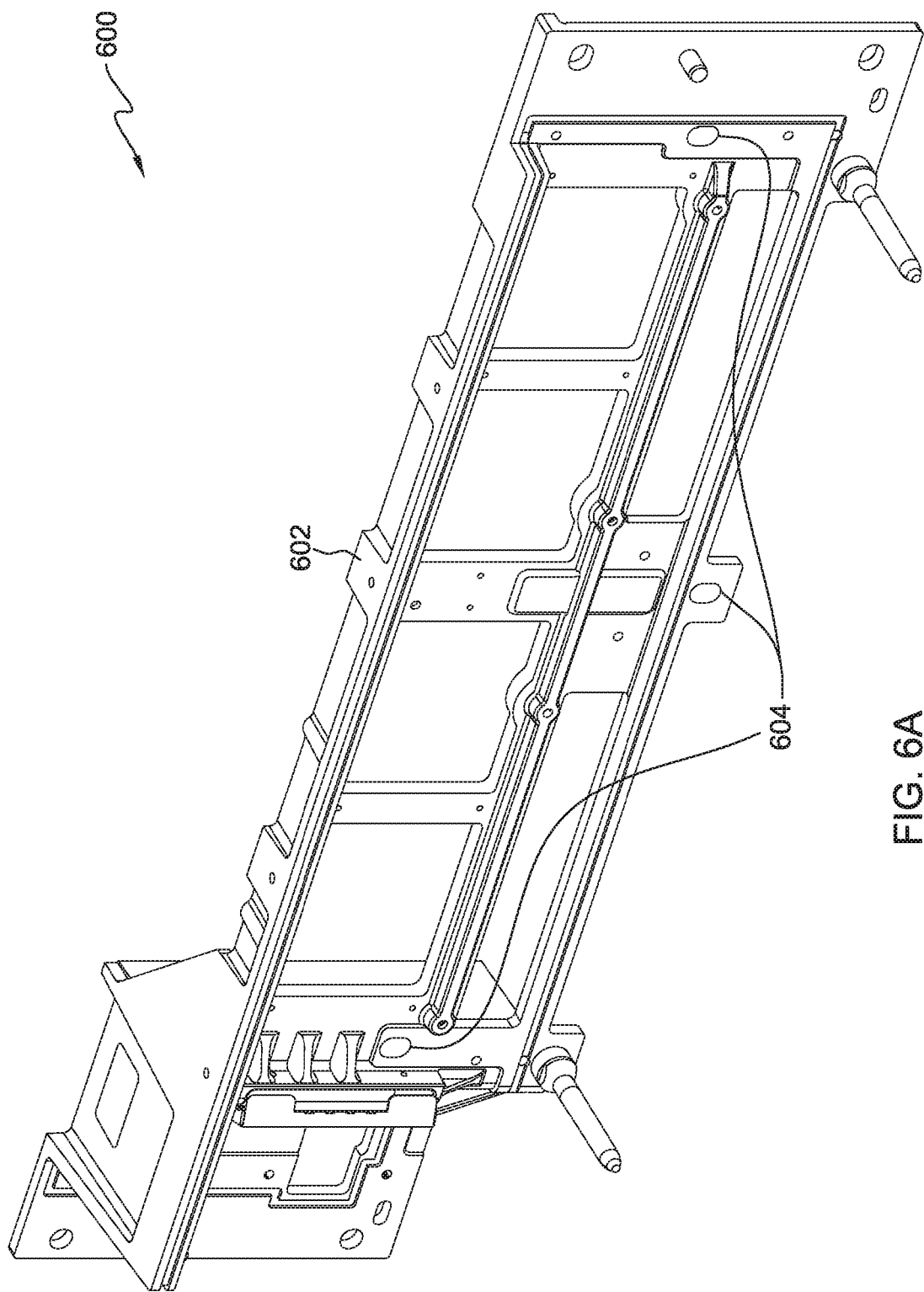
FIG. 6A illustrates a bulkhead assembly, in accordance with embodiments of the present invention.

FIG. 6A illustrates a view of bulkhead assembly 600, in accordance with embodiments of the present invention.

In the depicted embodiment, bulkhead assembly 600 includes bulkhead 602 and CEC screw retention features 604. In one embodiment, bulkhead 602 provides a structure, such as bulkhead 106 (previously discussed in FIG. 1), which can facilitate mating of an AMA and a DCA to a CEC. In an example embodiment, bulkhead 602 is a component of a rack of computing devices, such as rack 102.

In one embodiment, CEC screw retention features 604 are threaded screw receiving features that correspond to screw attachments from a CEC. In an example, a CEC (e.g., CEC 108) couples to bulkhead 602 utilizing screws (or other attachment methods) and CEC screw retention features 604. In another embodiment, bulkhead 602 can include a different number of CEC screw retention features 604 (e.g., more or less than the depicted number of retention features). In yet another embodiment, bulkhead 602 can include CEC screw retention features 604 different positions in bulkhead 602. In other embodiments, CEC screw retention features 604 can be other forms of receiving features that are capable of coupling to attachment features of a CEC (e.g., receiving features for fasteners).

Figure 6B:
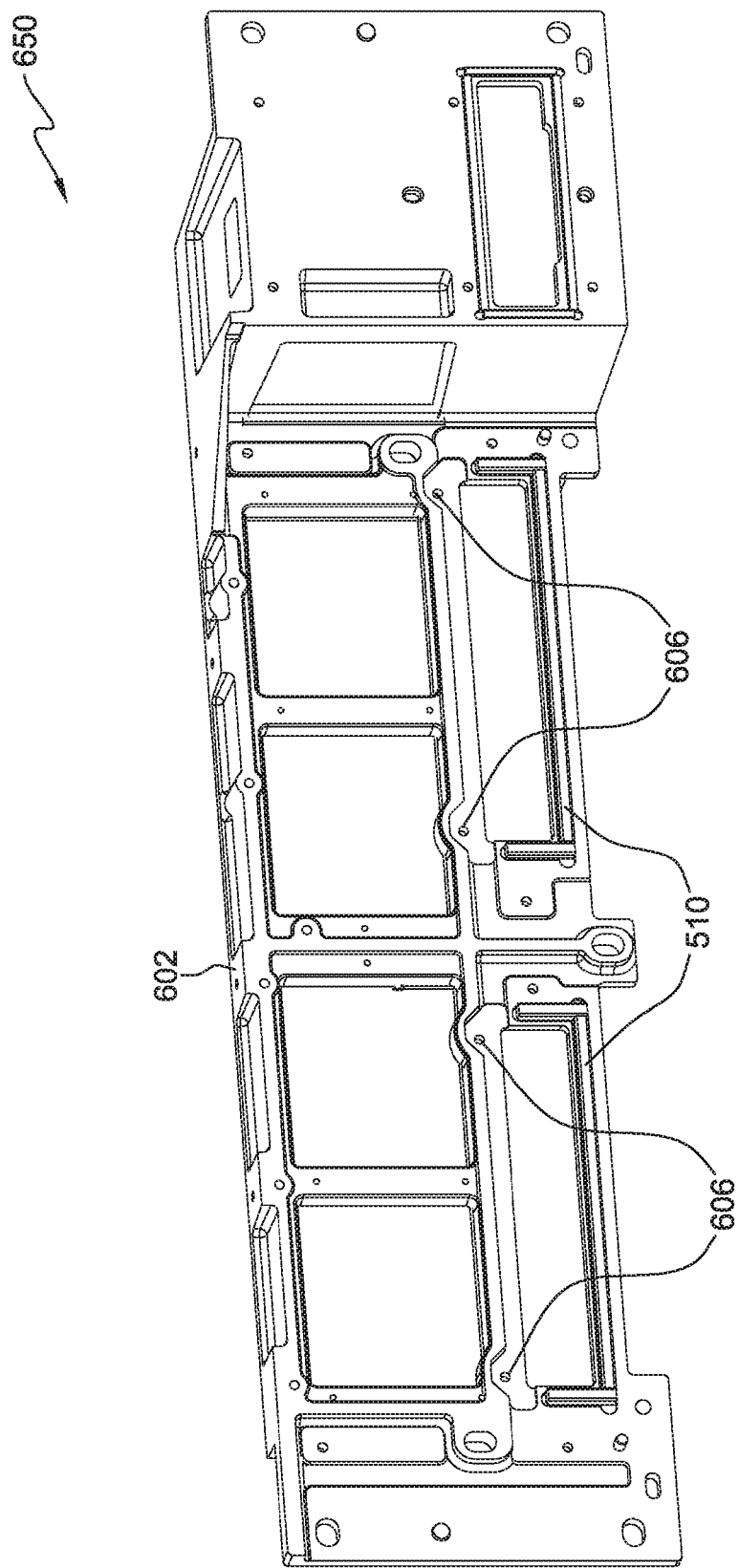
FIG. 6B illustrates a bulkhead assembly, in accordance with embodiments of the present invention.

FIG. 6B illustrates a view of bulkhead assembly 650, in accordance with embodiments of the present invention.

In the depicted embodiment, bulkhead assembly 650 is a depiction of the opposite side of bulkhead 602, relative to the depiction of bulkhead 602 in bulkhead assembly 600. Bulkhead 602 includes gasket 510 and DCA screw retention features 606. Gasket 510 is a feature of bulkhead 602, which facilitates prevention of excessive electromagnetic interference (EMI) energy from escaping from the area surrounding the mated connection between a DCA and bulkhead 602 (discussed in further detail with regard to FIG. 5B).

In one embodiment, DCA screw retention features 606 are threaded screw receiving features of bulkhead 602 that correspond to spring-loaded screw assemblies 222 of DCA 202. In another embodiment, DCA screw retention features 606 also include features to accommodate guide tubes 224 of DCA 202. In an example, a DCA 202 couples to bulkhead 602 utilizing spring-loaded screw assemblies 222 mating to corresponding instances of DCA screw retention features 606. In this example, DCA 202 couples to bulkhead 602 on the opposite side of bulkhead 602 relative to the coupled CEC, which causes electronic connections of the CEC and DCA 202 to mate. In other embodiments, DCA screw retention features 606 can be other forms of receiving features that are capable of coupling to spring-loaded screw assemblies 222 of DCA 202 (e.g., receiving features for fasteners).

Figure 7:
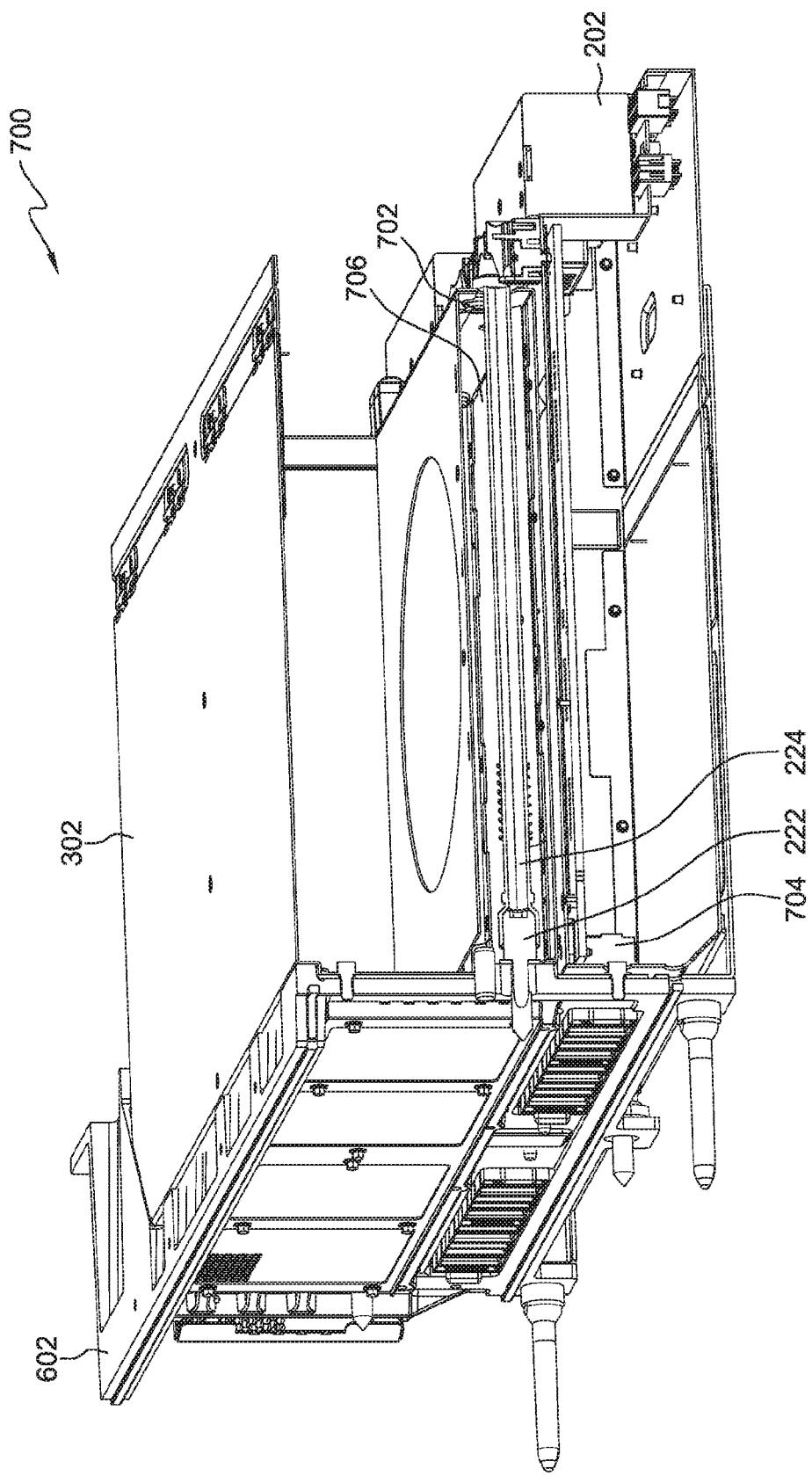
FIG. 7 illustrates a cross-sectional view of an assembly of an electronic assembly, a bulkhead assembly, and a supporting structure, in accordance with embodiments of the present invention.

FIG. 7 illustrates a cross-sectional view of connected assembly 700, in accordance with embodiments of the present invention.

In the depicted embodiment, connected assembly 700 includes an assembly of DCA 202, AMA 302, and bulkhead 602. DCA 202 is inserted into AMA 302 and coupled to AMA 302 utilizing support screw attachment 702 (i.e., coupling of retention screws 215 to threaded receivers 306). Additionally, DCA 202 is coupled to bulkhead 602 utilizing spring-loaded screw assemblies 222 (e.g., coupled to DCA screw retention features 606). DCA 202 is connected to a CEC utilizing DCA connector 704. In various embodiments, DCA connector 704 is comprised of electronic connections of DCA 202 that can attach to corresponding electronic connections of a CEC.

In additional embodiments, AMA 302 includes air flow plenum 706. In one embodiment, air flow plenum 706 facilitates improved air circulation within AMA 302. For example, air flow plenum 706 is an opening within AMA 302 that does not include an obstruction (e.g., a support screw for DCA 202), which provides for a less-obstructed air flow path through connected assembly 700. In an example embodiment, air flow plenum 706 includes top portions of guide tube relief bumps 304, which separate guide tubes 224 from air flow plenum 706.

In an example embodiment, once DCA 202 is assembled to AMA 302, the coupling features of retention screws 215 and spring-loaded screw assemblies 222 act to mechanically isolate the connector system (e.g., DCA connector 704) from out-of-phase motion and attributable plating connector wear. Additionally, the coupling features of retention screws 215 and spring-loaded screw assemblies 222 establish a secondary electrical grounding path within connected assembly 700.

What is claimed is:

1. An apparatus for mating computing device structures, the apparatus comprising:
    a first bracket coupled to a first edge of a pluggable electronic device, the first bracket comprising a first set of one or more attachment features that are capable of coupling to corresponding receiving features of a first supporting structure; and
    a second bracket coupled to a second opposing edge of the pluggable electronic device, the second bracket comprising a second set of one or more attachment features that are capable of coupling to corresponding receiving features of a second supporting structure, said second supporting structure adapted to connect said pluggable electronic device with a further electronic device such that electrical connections of said further electronic device mate with corresponding electrical connections of said pluggable electronic device.

2. The apparatus of claim 1, further comprising:
    one or more guide tubes coupled to the pluggable electronic device, the one or more guide tubes each comprising an opening through the one or more guide tubes; and
    wherein the opening is aligned to a respective attachment feature of the second set of one or more attachment features.

3. The apparatus of claim 2, further comprising:
    one or more rotatable latches;
    the one or more rotatable latches coupled to the pluggable electronic device;
    the one or more rotatable latches each including a recessed feature that comprises an opening through the one or more rotatable latches; and
    wherein the opening is aligned to a respective opening of the one or more guide tubes.

4. The apparatus of claim 1, wherein the first set of one or more attachment features are a set of one or more screw mechanisms.

5. The apparatus of claim 4, wherein the set of one or more screw mechanisms comprises a cap portion that is capable of manual coupling the set of one or more screw mechanisms to corresponding receiving features of a supporting structure.

6. The apparatus of claim 1, wherein the second set of one or more attachment features are a set of one or more spring-loaded screw assemblies.

7. The apparatus of claim 1, wherein the pluggable electronic device is a power supply.

8. The apparatus of claim 2,
    wherein the first supporting structure encloses at least a portion of the pluggable electronic device.

9. The apparatus of claim 8, wherein the first set of one or more attachment features are coupled to corresponding receiving features on a face portion of the first supporting structure.

10. The apparatus of claim 8, wherein the first supporting structure is an air moving assembly (AMA).

11. The apparatus of claim 8, wherein the second supporting structure is coupled to a back portion of the first supporting structure.

12. The apparatus of claim 8:
    wherein the first supporting structure comprises one or more recess features from a face portion of the first supporting structure through to a back portion of the first supporting structure; and
    wherein the one or more recess features accommodate the one or more guide tubes.

13. The apparatus of claim 8, wherein the first support structure includes an air flow plenum that does not include the first set of one or more attachment features, the one or more guide tubes, and the second set of one or more attachment features.

14. An apparatus for mating computing device structures, the apparatus comprising:
    a first bracket coupled to a first edge of a pluggable electronic device, the first bracket comprising a first set of one or more attachment features that are capable of coupling to corresponding receiving features on a face portion of a first supporting structure; and
    a second bracket coupled to a second opposing edge of the pluggable electronic device, the second bracket comprising a second set of one or more attachment features that are capable of coupling to corresponding receiving features of a second supporting structure, said second supporting structure adapted to connect said pluggable electronic device with a further electronic device such that electrical connections of said further electronic device mate with corresponding electrical connections of said pluggable electronic device, and
    wherein the second supporting structure is coupled to a back portion of the first supporting structure.

15. The apparatus of claim 14, wherein the first set of one or more attachment features are a set of one or more screw mechanisms that comprise a cap portion that is capable of manual coupling the set of one or more screw mechanisms to corresponding receiving features of a supporting structure.

16. The apparatus of claim 14:
wherein the second set of one or more attachment features are a set of one or more spring-loaded screw assemblies; and
wherein the set of one or more spring-loaded screw assemblies are capable of retracting into an enclosed position within the second bracket when the set of one or more spring-loaded screw assemblies are not coupled to a supporting structure or not engaged by a tool.

17. The apparatus of claim 14, further comprising:
one or more guide tubes coupled to the pluggable electronic device, the one or more guide tubes each comprising an opening through the one or more guide tubes capable of receiving a tool through the opening to engage a respective attachment feature; and
wherein the opening is aligned to a respective attachment feature of the second set of one or more attachment features.

18. The apparatus of claim 17, further comprising:
one or more rotatable latches;
the one or more rotatable latches coupled to the pluggable electronic device;
the one or more rotatable latches each including a recessed feature that comprises an opening through the one or more rotatable latches; and
wherein the opening is aligned to a respective opening of the one or more guide tubes and capable of receiving a tool through the opening to engage the respective opening to the one or more guide tubes.

19. The apparatus of claim 17:
wherein the first supporting structure comprises one or more recess features from a face portion of the first supporting structure through to a back portion of the first supporting structure; and
wherein the one or more recess features accommodate the one or more guide tubes.

* * * * *